United States Patent [19]

Harrell et al.

[11] 4,334,755
[45] Jun. 15, 1982

[54] APPARATUS AND METHOD FOR PROCESSING LITHOGRAPHIC PLATES

[75] Inventors: Robert E. Harrell, Manchester; Tedd L. Harrell, Springfield; Edward H. Parker, Ballwin, all of Mo.

[73] Assignee: Western Litho Plate & Supply Co., St. Louis, Mo.

[21] Appl. No.: 135,252

[22] Filed: Mar. 31, 1980

[51] Int. Cl.³ .............................................. G03D 5/04
[52] U.S. Cl. .................................. 354/299; 354/317; 354/325; 118/64; 118/69; 118/641
[58] Field of Search ............... 354/297, 299, 317, 318, 354/319, 325, 322; 355/27, 100, 85; 118/641, 64, 65, 69

[56] References Cited

U.S. PATENT DOCUMENTS

| | | | |
|---|---|---|---|
| 2,555,874 | 6/1951 | Coughlin | 354/317 |
| 3,589,261 | 6/1971 | Krikelis | 354/322 |
| 3,593,641 | 7/1971 | Adams et al. | 354/317 |
| 3,702,581 | 11/1972 | Speakman | 355/100 |
| 3,981,583 | 9/1976 | Tsuchida et al. | 354/325 |
| 4,081,577 | 3/1978 | Horner | 354/325 |
| 4,128,326 | 12/1978 | Selak | 354/317 |
| 4,222,656 | 9/1980 | Harrell et al. | 354/325 |

Primary Examiner—L. T. Hix
Assistant Examiner—Alan Mathews
Attorney, Agent, or Firm—Senniger, Powers, Leavitt and Roedel

[57] ABSTRACT

Apparatus for processing lithographic plates after they have been exposed and developed having a system for feeding plates forward one after another in a predetermined path with the exposed and developed face of the plate facing up, a heating system for heating each plate as it travels along said path, a system for blowing air on each plate to cool it, a system for spraying water on and scrubbing the upper face of each plate for washing it, and a system for delivering preservative onto and rubbing it over the upper face of each plate.

29 Claims, 8 Drawing Figures

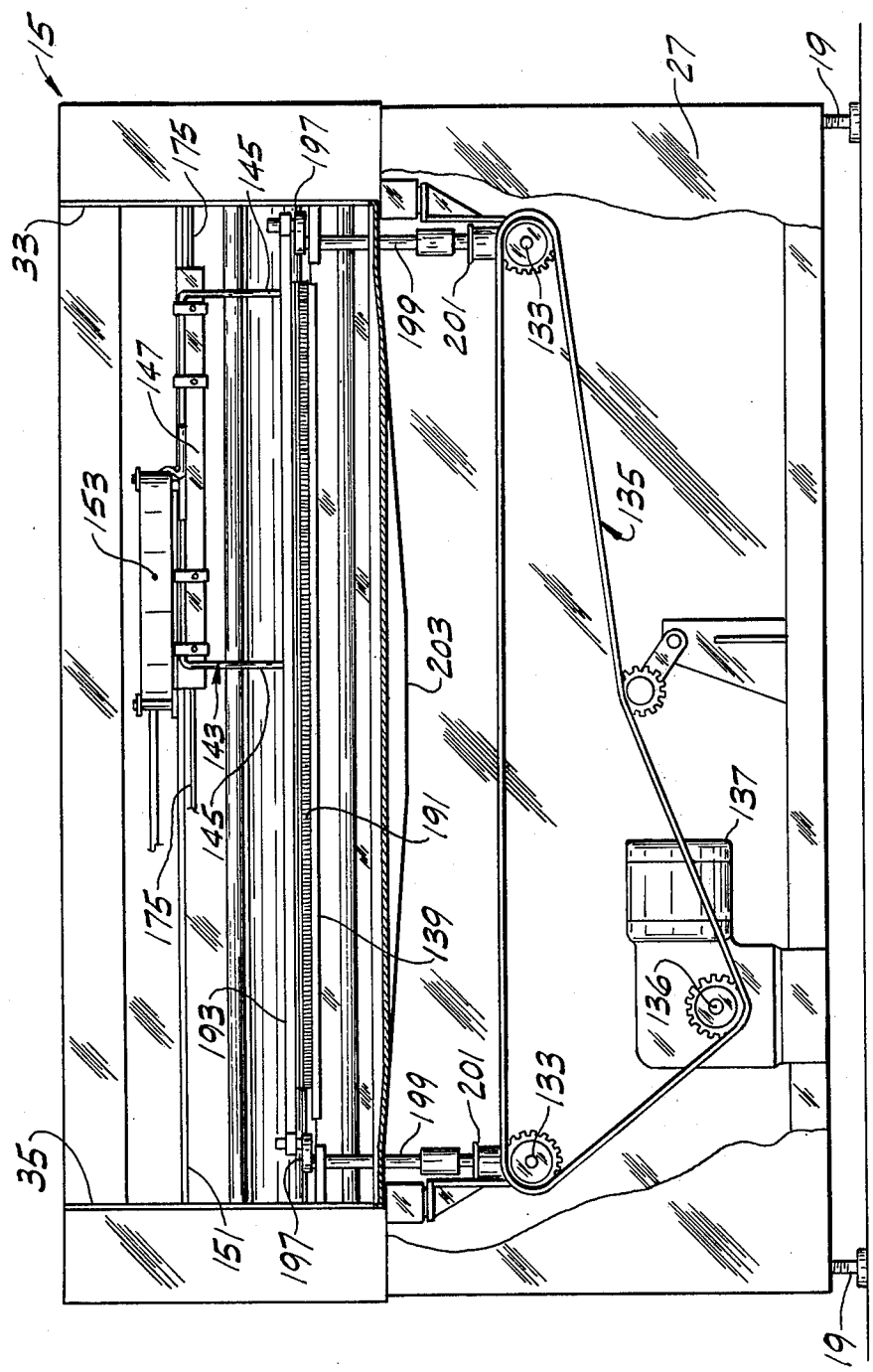

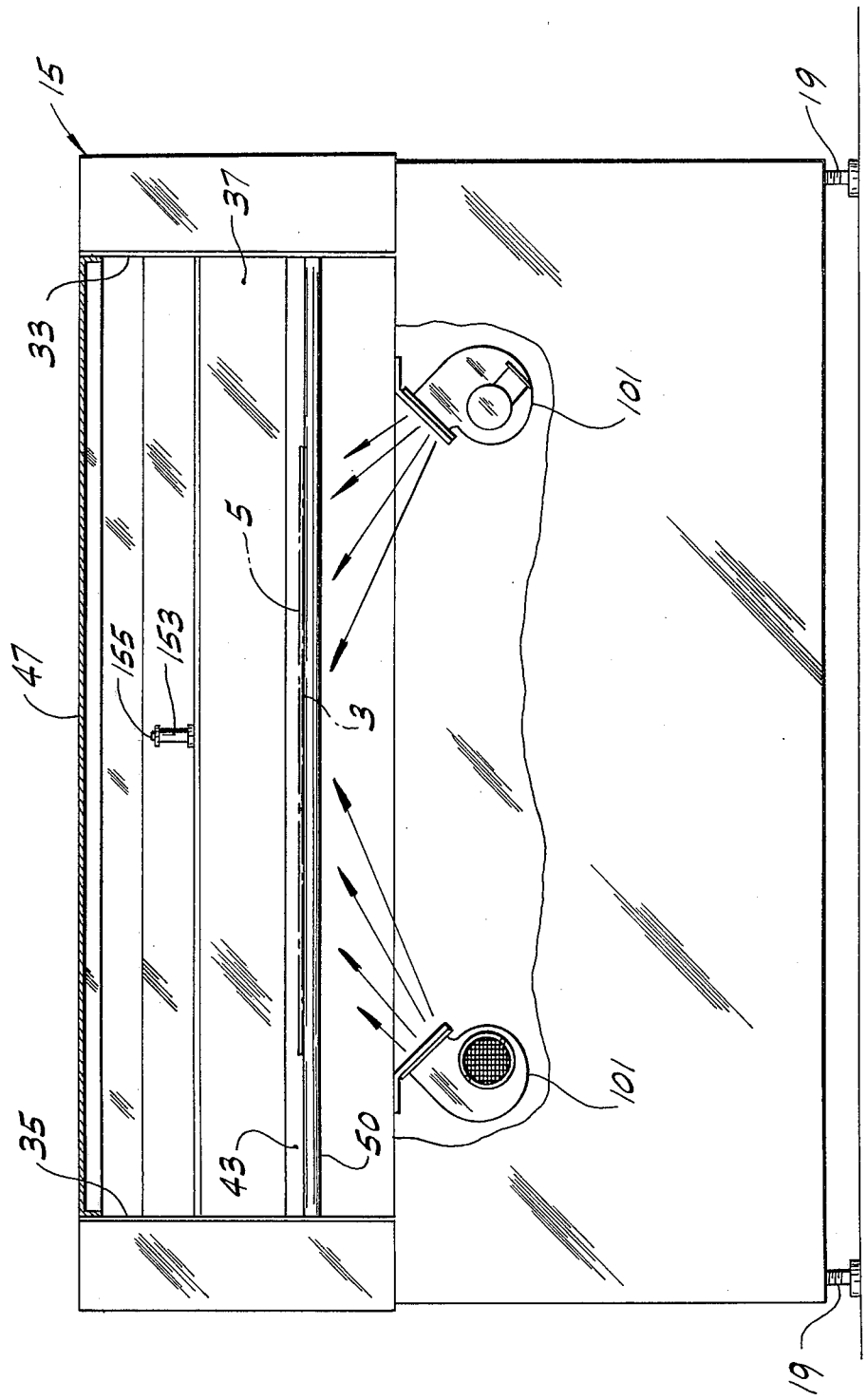

APPARATUS AND METHOD FOR PROCESSING LITHOGRAPHIC PLATES

BACKGROUND OF THE INVENTION

This invention relates to apparatus for processing exposed lithographic plates, and more particularly to apparatus and method for processing exposed and developed lithographic plates for a thermal cure of the plates.

The invention is especially concerned with apparatus for use in a system for processing exposed and developed lithographic plates in which the plates are provided, in their printing (oleophilic) areas with a thermal curing agent or agents adapted on being heated to cure to a more abrasion resistant and solvent resistant state, thereby to extend the press life of the plates and to reduce plate, paper and press costs. In this system, the plates may also be provided with a protective coating to insure that, in the thermal curing operation, the non-printing (hydrophilic) areas of the plate remain hydrophilic.

SUMMARY OF THE INVENTION

Among the several objects of the invention may be noted the provision of apparatus for efficiently and rapidly processing exposed and developed lithographic plates for thermal curing of the plates in the above-described system; the provision of such apparatus in which the plates, after the thermal curing, are cooled and coated with a preservative, without wrinkling of the plates; the provision of such apparatus for processing plates to which a coating has been applied for protecting the hydrophilic areas during the thermal curing, the provision of an improved method for processing exposed and developed lithographic plates for thermal curing of the plates to a more abrasion resistant and solvent resistant state.

Basically, apparatus of this invention comprises means for feeding forward lithographic plates which have been exposed and developed and which have in their printing areas a thermal curing agent or agents adapted on being heated to cure to a more abrasion resistant and solvent resistant state, each plate being fed forward in a predetermined path with the exposed and developed face of the plate facing up. Means is provided in a first zone along said path for heating each plate to a temperature such as to effect the curing of the curing agent or agents (e.g., for the thermal curing of the plate). Means is provided in a second zone along said path for temperate cooling of each plate. And means is provided in a third zone along said path for applying a preservative on said face of each plate.

Other objects and features will be in part apparent and in part pointed out hereinafter.

BRIEF DESCRIPTION OF THE DRAWINGS

FIG. 7 is a view from the right end of FIGS. 1, 2 and 4 with parts broken away;

FIG. 8 is a view from the right end broken away and in vertical transverse section on line 8—8 of FIG. 5.

Corresponding reference characters indicate corresponding parts throughout the several views of the drawings.

DESCRIPTION OF THE PREFERRED EMBODIMENT

Figure 1:
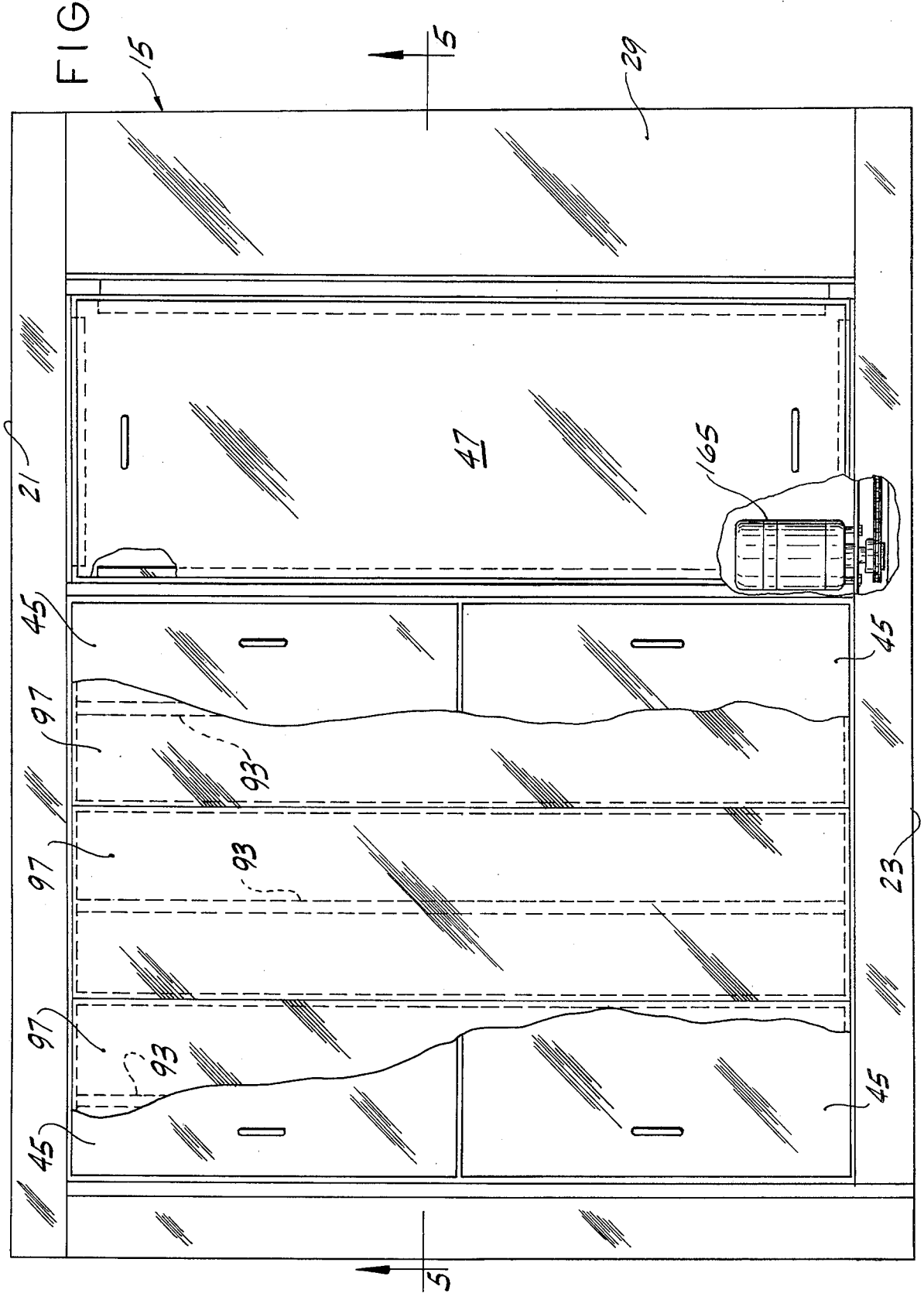
FIG. 1 is a plan of the apparatus of this invention, with parts broken away to show interior detail.

Referring to the drawings, apparatus of this invention is shown generally to comprise means indicated in its entirety by the reference numeral 1 for feeding lithographic plates 3 which have been exposed and developed forward one after another in a predetermined path with the exposed and developed face 5 of the plate facing up, the plates having in their printing areas a thermal curing agent or agents adapted on being heated to cure to a more abrasion resistant and solvent resistant state. Means indicated generally at 7 is provided in a first zone A along said path for heating each plate to a temperature such as to effect the curing of the curing agent or agents as it is fed forward. Means indicated generally at 9 is provided in a second zone B along said path for temperate cooling of each plate without wrinkling the plate as it is fed forward and after it has been heated. And means indicated generally at 11 is provided in a third zone C along said path for applying a preservative on the said face 5 of each plate as it is fed forward and after it has been cooled.

More particularly, the apparatus comprises a cabinet structure generally designated 15 comprising a base frame 17 on adjustable legs 19 and having sides 21 and 23, ends 25 and 27 and a top 29. The end 25 of the cabinet structure may be referred to as its entrance or upstream end and the other end 27 as its exit or downstream end, with relation to the direction of feed of the plates to be processed, which is left to right as viewed in FIG. 5. Side 21 may be referred to as the left side and side 23 as the right side, as viewed in downstream direction. The cabinet structure has an upper portion indicated at 31 above the top of the base frame. Here it has left and right side frame plates 33 and 35 spaced inward from the sides 21 and 23. It also has an intermediate transverse partition 37 extending between the side frame plates 33 and 35 located somewhat nearer the exit end 27 of the cabinet structure than its entrance end.

The entrance end 25 of the cabinet structure, the partition 37 and the top 29 of the cabinet define a chamber 39 enclosing the feeding means 1 and the heating means 7 in the first zone A. A horizontal slot 41 in the entrance end 25 of the cabinet structure provides an entrance opening for entry of plates 3 into the chamber. The plates 3 are fed forward one after another through the chamber with their exposed and developed ("imaged" or "printing") face 5 up and exit from the chamber through an exit opening constituted by a horizontal slot 43 in the partition 37. The top 29 of the cabinet includes a pair of readily removable top panels each designated 45 for the chamber 39, and a readily removable top panel 47 downstream from the panels 45.

The feeding means 1 comprises conveyor means for feeding the plates 3 through the chamber 39 from the entrance opening 41 to the exit opening 43 for the chamber 39 and through the stated second and third zones B and C for the heating and cooling of the plates followed by the application of preservative thereto. More particularly, the feeding means 1 comprises a series of rolls 49 in chamber 39 for supporting a plate 3 as it is fed forward through the chamber to the exit opening 43, a roll 50 spaced slightly downstream from the exit opening 43, a first pair of feed rolls 51 downstream from roll 50 adapted to receive a plate exiting from the chamber over roll 50 and feed the plate forward, a second pair of feed rolls 53 spaced downstream from the first pair adapted to receive a plate fed forward by the first pair and feed it forward, a third pair of feed rolls 55 spaced downstream from the second pair adapted to receive a plate fed forward by the second pair and feed it forward, and means indicated generally at 57 for driving all these rolls to feed the plates forward. The rolls 49, which may simply be lengths of pipe, are shown as arranged in a plane inclined downwardly at a low angle from the entrance opening 41 to the exit opening 43 of chamber 39, journalled at their ends in bearing members each designated 59 on the outside of the frame side plates 33 and 35. An idler guide roll 61 may be provided just inside the entrance opening 41. Roll 50 may also be a length of pipe. Each pair of feed rolls 51, 53 and 55 comprises an upper roll designated by the subscript a and a lower roll designated by the subscript b, these rolls extending horizontally across the apparatus between the frame side plates 33 and 35. Each lower roll b has a shaft 63 journalled in fixed bearings 65 on the outside of the frame side plates. Each upper roll a has a shaft 67 extending through openings in the frame side plates journalled in bearings 69 on the outside of these plates, these bearings being pivoted as indicated at 70 for being movable up and down by means such as indicated at 71 including adjustment rods 73 and turnbuckles 75 corresponding to the rods and turnbuckles shown in the copending coassigned application of Robert E. Harrell et al., Ser. No. 18,993, filed Mar. 9, 1979 issued as U.S. Pat. No. 4,222,656 Sept. 16, 1980. This is to enable the upper rolls a to be moved out of engagement with the lower rolls b when the apparatus is not in use to avoid flattening the rolls, and to enable adjustment of the pressure of the rolls on the plates 3. The three pairs 51, 53 and 55 of feed rolls have their pass planes generally coplanar with the upper surface plane of rolls 49.

The means 57 for driving all the feed rolls (including the rolls 49) comprises an electric motor/speed reducer unit 77 in the cabinet structure 15 adjacent its exit end 25, the output shaft 79 of the speed reducer being connected by a chain and sprocket drive 81 to the shaft 63 feed roll 55b on the outside of the frame side plate 33. A chain and sprocket drive 83 interconnects shafts 63 of rolls 55b, 53b and 51b, and a chain and sprocket drive 85 interconnects shaft 63 of roll 51b, roll 50 and rolls 49. Adjustments for the chains of drives 83 and 85 are indicated at 87 and 89.

The heating means 7 comprises a series of heaters each generally designated 91 mounted in the chamber 39 above the series of conveyor rolls 49 in the chamber for radiating heat down on the upper faces 5 of the plates 3 being fed forward through the chamber. Each heater 91 comprises an electrical heating element 93, e.g., a metal sheath heater and a reflector 95 for reflecting heat from the heating element 93 down on to the upper faces of the plates. Each of the heaters has a housing 97 carrying the reflector and the heating element, the housings being mounted in the chamber 39 extending transversely between the frame side plates 33 and 35 above the series of rolls 49. A reflector 99 is provided below the series of rolls 49 for reflecting heat back up toward said series of rolls in chamber 39. Reflector 99 preferably has insulation on its bottom.

Figure 5:
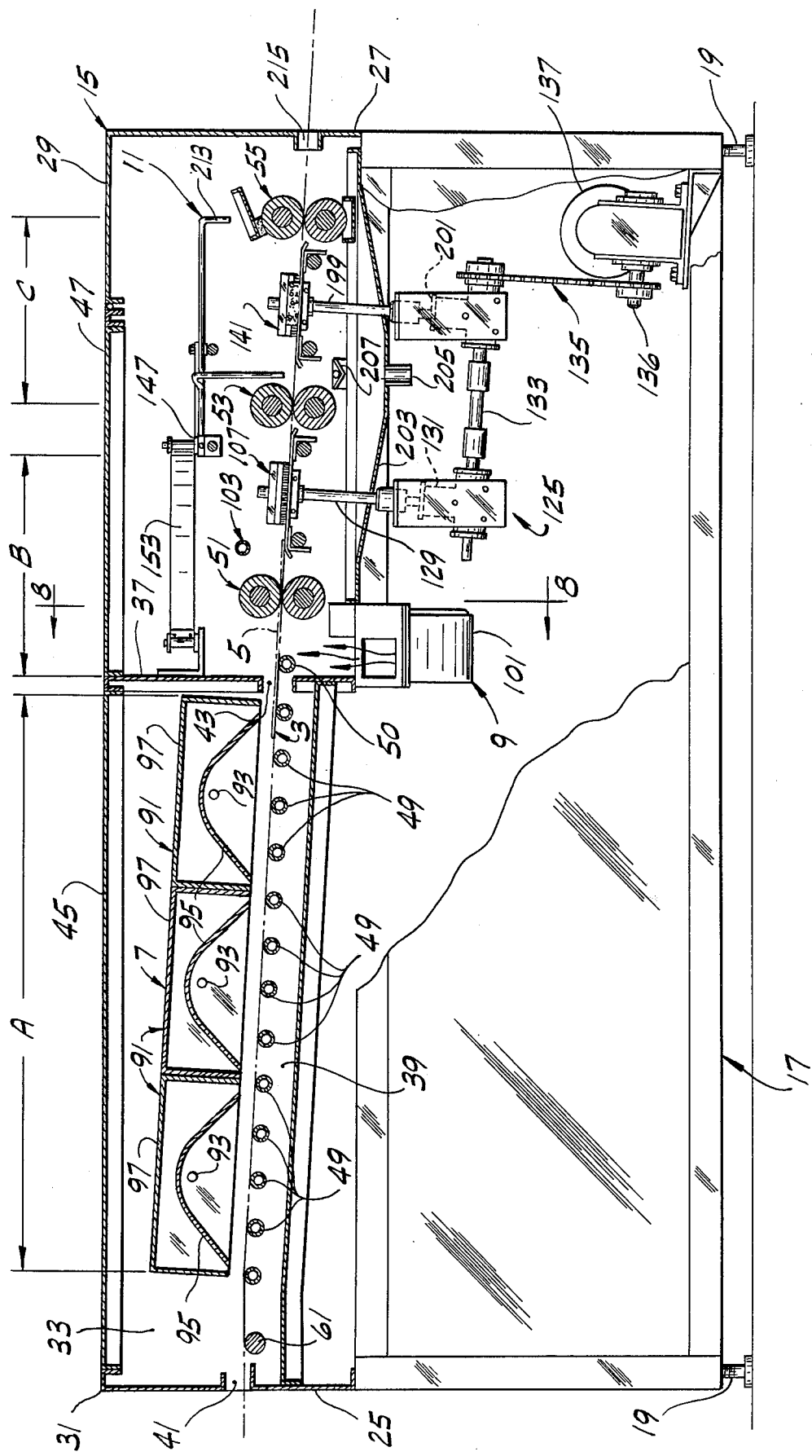
FIG. 5 is a vertical longitudinal section on line 5—5 of FIG. 1.
Figure 6:
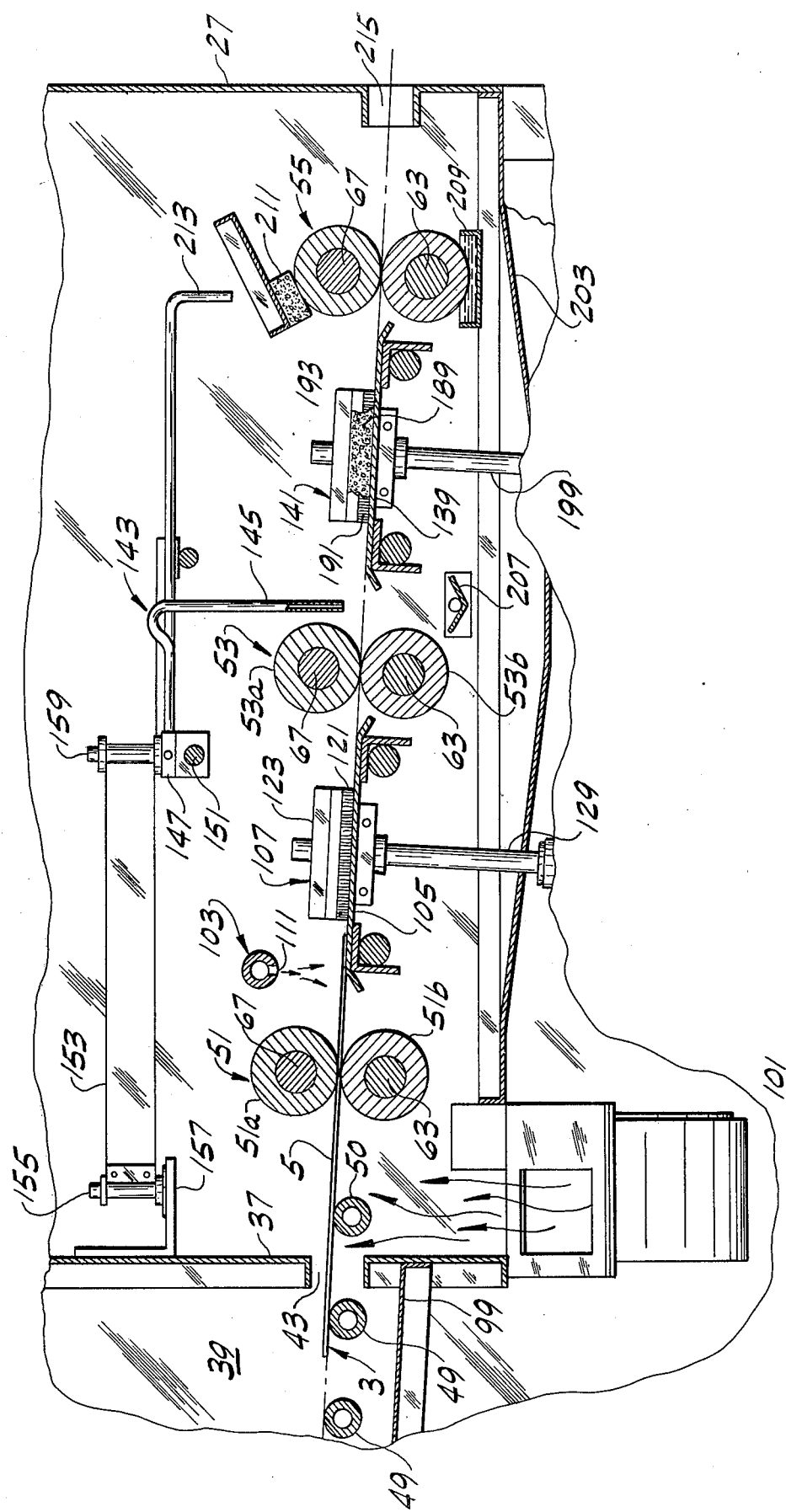
FIG. 6 is part of FIG. 5 enlarged to show detail.

The cooling means 9 comprises means for blowing air on the plates 3 in the said cooling zone B as they exit through the said exit opening 43 of the chamber 39. As shown in FIGS. 5, 6 and 8, this blowing means comprises a pair of blowers each designated 101 mounted in the cabinet structure 15 in position for blowing air upwardly on the bottom of a plate 3 as the plate exits through opening 43 and before it reaches the first pair 51 of feed rolls.

Figure 2:
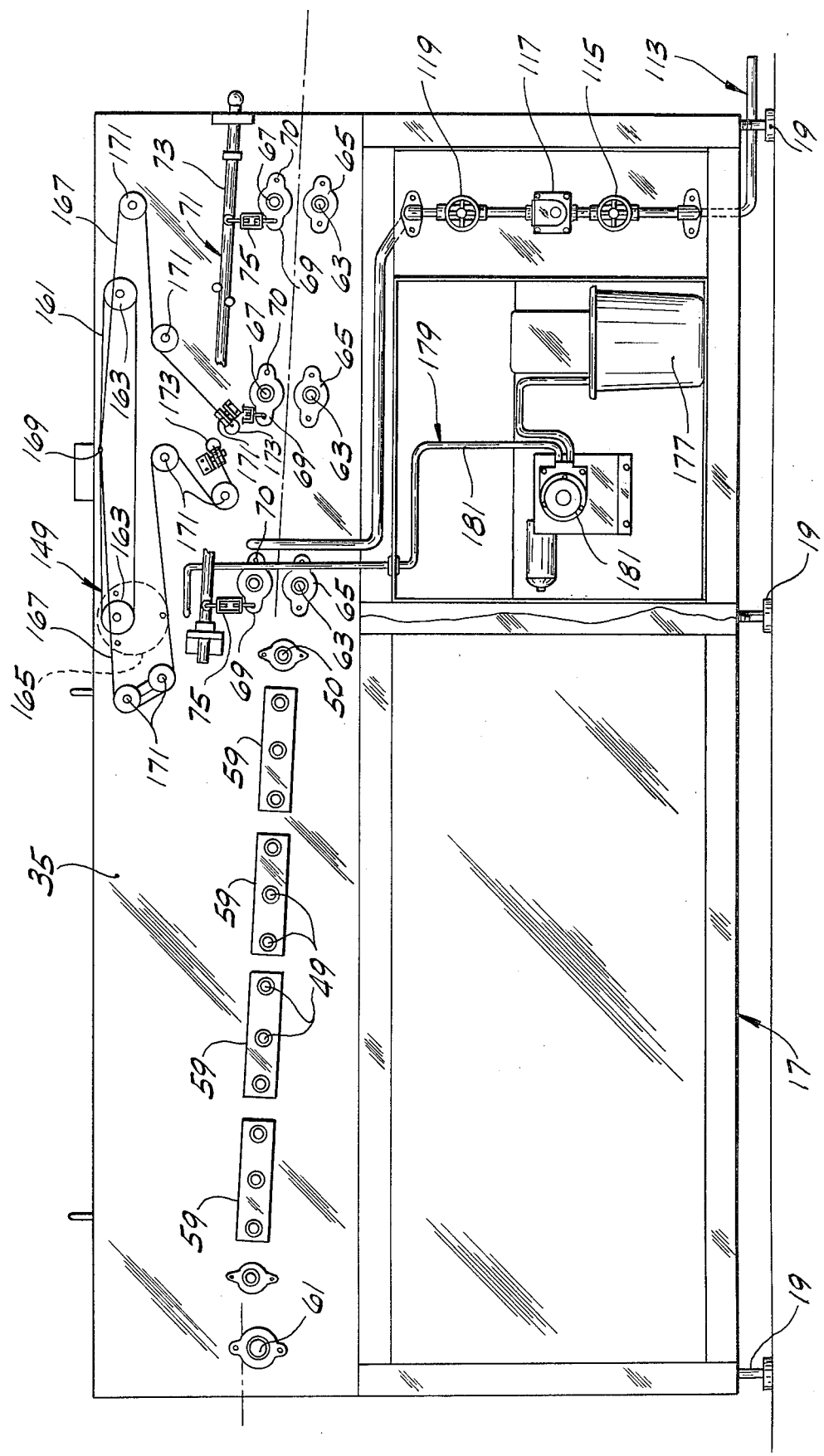
FIG. 2 is a side elevation of the apparatus as viewed from what is its right side facing in the direction of feed of plates through the apparatus, partly broken away.
Figure 3:
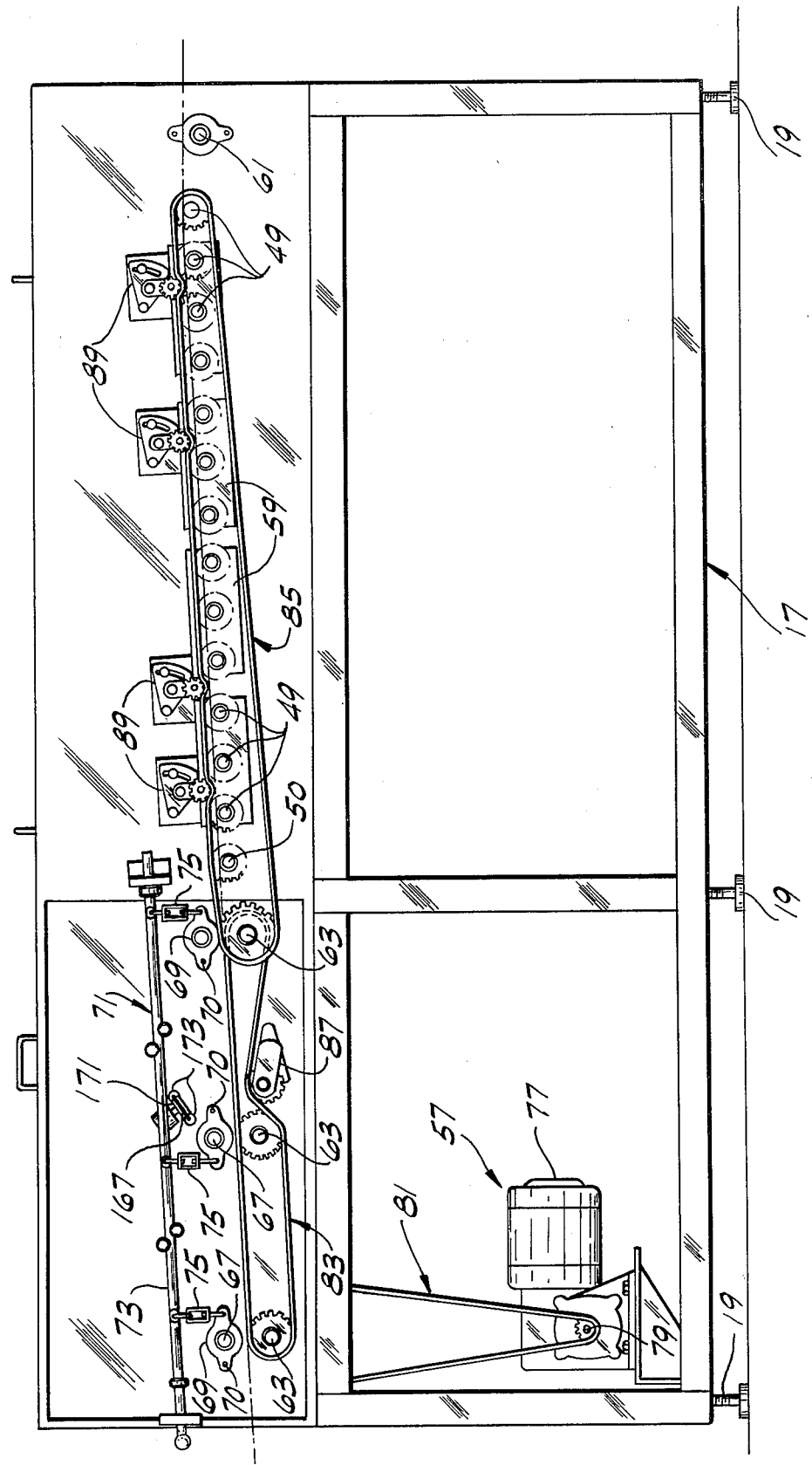
FIG. 3 is a left side elevation, partly broken away.
Figure 4:
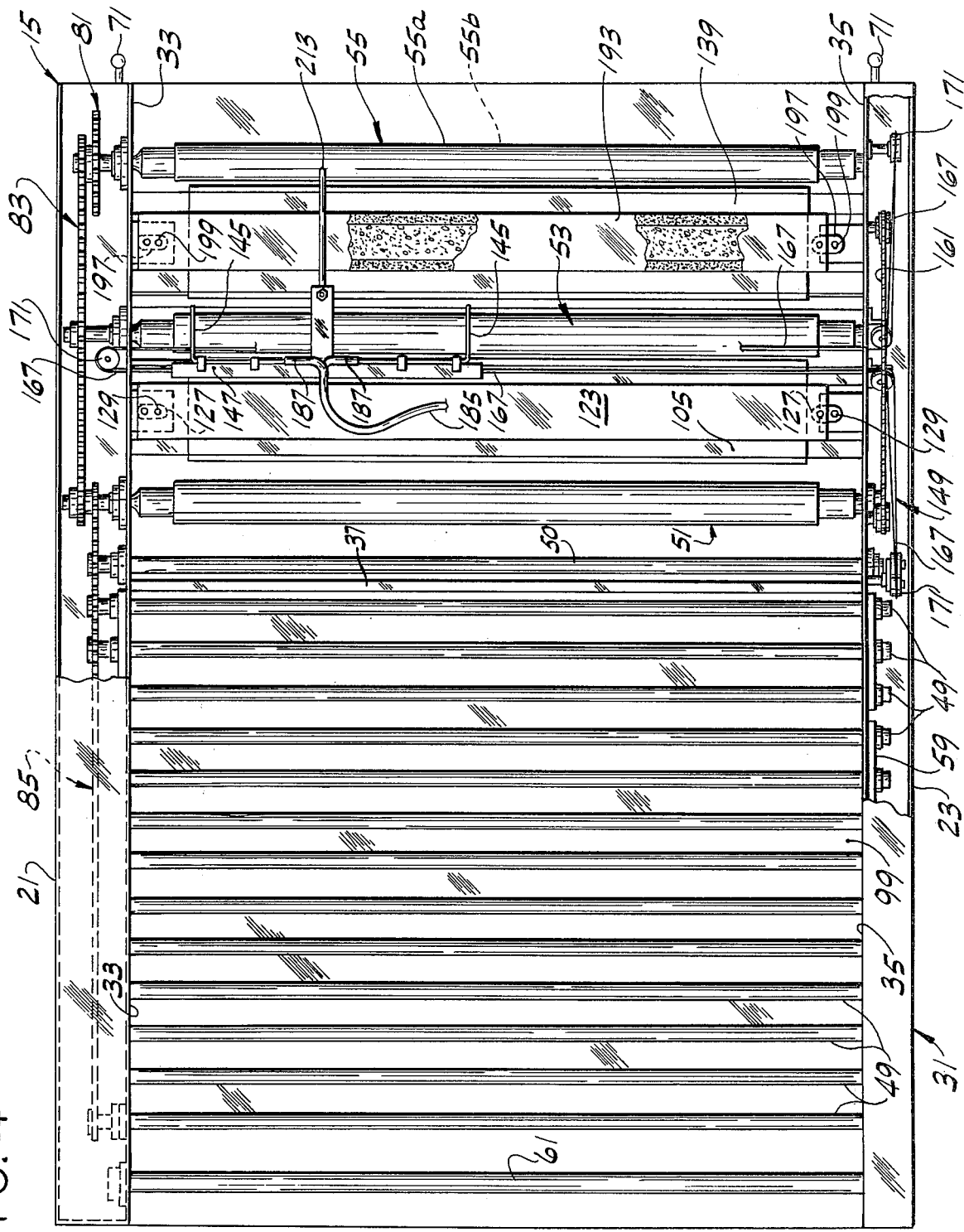
FIG. 4 is a plan with parts broken away to show interior detail.

The cooling means further comprises means 103 for spraying water down on the upper face of a plate as it exits from the first pair 51 of feed rolls. At 105 is indicated a platen over which a plate 3 is fed between the first and second pairs 51 and 53 of feed rolls, the platen being downstream from the spray means 103. Means indicated generally at 107 is provided for rubbing the upper (sprayed) faces of the plates as they travel over the platen for washing them. The spraying means comprises a spray pipe extending transversely of the apparatus from one frame side plate 33 to the other 35 above the path of travel of the plates 3 between the first pair 51 of rolls and the rubbing means 107, this pipe having spray holes 111 spaced along its length at its bottom for spraying water down on a plate. The pipe 109 is supplied with water from a suitable source via a line 113 (see FIG. 2) including an on-off valve 115, a solenoid control valve 117 and a flow control valve 119. Other suitable plumbing may be used. The rubbing means 107 comprises an elongate brush 121 carried by an elongate bar 123 extending transversely of the apparatus on the platen 105, and means 125 for moving the bar (and brush) back and forth crosswise of the apparatus. The latter means preferably moves the bar and brush with an orbital movement. For this purpose, cranks 127 are provided at the ends of the bar. These cranks are at the upper end of shafts 129 driven by gearing at 131 from countershafts 133 driven via a chain and sprocket drive 135 from the output shaft 136 of an electric motor/speed reducer unit 137. Drive 135 may be arranged in the line of the apparatus instead of transversely as shown.

The preservative applying means 11 comprises a second platen 139 over which a plate 3 is fed between the second and third pairs 53 and 55 of rolls, second means 141 for rubbing the upper face of a plate as it travels over the second platen, and means 143 for delivering preservative onto the upper face of the plate between the second pair 53 of feed rolls and the said second rubbing means 141. The preservative delivering means 143 comprises nozzle means constituted by a pair of nozzles each designated 145, means constituted by a carriage 147 mounting the nozzles for movement transversely of the path of the plates 3 above the plates, and means 149 for moving the carriage to move the nozzles transversely of said path back and forth over a plate as the plate is fed forward below the nozzles. The carriage 147 is slidable transversely of the apparatus on a guide rod 151 extending between the frame side plates 33 and 35, being held against tilting on the rod by a flexible resilient strap (e.g., a plastic strap) 153 pivoted at 155 on a bracket 157 on the partition 37 and pivoted at 159 to the carriage. The carriage is reciprocable through a stroke generally from one frame side plate to the other to traverse the nozzles 145 through a stroke for distributing preservative across a plate.

The means 149 for moving the carriage comprises an endless conveyor means on the outside of the frame side plate 35 comprising an endless chain 161 trained around sprockets 163 driven by an electric motor/speed reducer unit 165 which is adapted to drive the chain continuously in one direction. The chain 161 is connected to the carriage by a cable system comprising two cables each designated 167 connected at 169 to the chain, the cables being trained around pulleys such as indicated at 171 and extending through holes such as indicated at 173 in the frame side plates to connections indicated at 175 with the left and right ends of the carriage. The arrangement is such that as connection 169 travels one way with the upper reach of chain 161, the carriage 147 is moved in one direction and as the connection travels the other way with the lower reach of the chain, the carriage is moved in the opposite direction.

Preservative (e.g., an asphaltum, gum and etch composition such as that sold by the assignee of this application under its trademark A.G.E.) is delivered to the nozzles 145 from a supply container at 177 via a delivery system 179 including a pump 181, a pipe 183 extending from the outlet of the pump and a flexible hose line system 185 extending to the carriage 147 and having connections 187 to the nozzles 145. The flexible hose line system 185 flexes as the carriage 147 moves back and forth.

The second rubbing means 141 (for rubbing the preservative over the upper face of a plate 3 as the plate travels over the second platen 139) comprises a sponge 189 surrounded by a brush 191 carried by an elongate bar 193 extending transversely of the apparatus on the platen 139, and means 195 for moving the bar (and combination sponge and brush) back and forth crosswise of the apparatus. The latter preferably moves the bar with an orbital movement. For this purpose cranks 197 are provided at the ends of the bar, these cranks being at the upper ends of shafts 199 driven by gearing 201 from the aforesaid countershafts 133.

Water is continuously sprayed down from the spray pipe 103 during the operation of the apparatus, excess water (e.g., water which sprays down between successive plates 3) being collected in a drain pan 203 in the cabinet structure 15 extending underneath the sets of rolls 51, 53 and 55 and drained off via a drain 205. Preservative is continuously delivered from the nozzles 145 during the operation of the apparatus, excess preservative which flows down between successive plates 3 being collected in an inclined trough 207 extending between the frame side plates 33 and 35 and returned to the supply container 177 for recirculation. Roll 55b rotates in a water bath 209. A sponge 211 contacting roll 55a is maintained damp by delivery of water from a nozzle 213 carried by the carriage. Plates 3 exiting from the set of rolls 55 exit from the cabinet structure 15 through an exit opening 215 in the exit end 27 of the cabinet structure.

In the operation of the apparatus and carrying out the method, plates 3 which have been exposed and developed and which are provided in their printing (oleophilic) aceas with a thermal curing agent or agents adapted on being heated to cure to a more abrasion and solvent resistant state, thereby to extend the press life of the plates and to reduce plate, paper and press costs, are suitably introduced one after another through the entrance opening 41 of the apparatus into the chamber 39. The plates may also be provided on their upper faces with a protective coating to insure that, in the thermal curing operation, the non-printing (hydrophilic) areas of the plate remain hydrophilic. The plates are guided over the roll 61 onto the series of feed rolls 49. The latter, roll 50 and the three sets of rolls 51, 53 and 55 are continuously driven, as are the carriage 147 and the brush 121 and sponge/brush 189, 191. The rolls 49 feed each plate forward and, as the plate is fed forward, it is heated by the heating means 7 for the thermal curing of the thermal curing agent or agents on its printing (oleophilic) areas. As each plate exits from the chamber 39 through the opening 43, it is cooled first by the air which is blown up on the bottom of the plate by the blowers 101 and subsequently by the spray of water from the spray pipe 103. The wetted plate is scrubbed by the brush 121 to wash off the protective coating. The plate is in effect squeegeed to dry it as it passes through the rolls 53, and is then coated with preservative via the nozzles 145 and sponge/brush 189, 191, the latter operating to rub the preservative over the plate.

The initial cooling of each plate 3 by means of the blowers 101 blowing air on the plates as they exit from chamber 39 and before they are further cooled by the spray of water from the spray pipe 103 is of importance in avoiding wrinkling of the plates. it has been found that if the plates are sprayed with cold water in their heated condition as they exit from the chamber 39 they may become badly wrinkled. It is contemplated that the plates may be washed with warm water instead of cold water to avoid wrinkling, in which case it may be possible to eliminate the air blowing means (or whatever other means may be used for cooling the plates before they are sprayed with water).

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. Apparatus for processing lithographic plates which have been exposed and developed and which have in their printing areas a thermal curing agent or agents adapted on being heated to cure to a more abrasion resistant and solvent resistant state, comprising:
   means for feeding plates forward one after another in a predetermined path with the exposed and developed face of the plate facing up;
   means in a first zone along said path for heating each plate to a temperature such as to effect the curing of the curing agent or agents;
   means in a second zone along said path for temperate cooling of each plate without wrinkling the plate;
   said feeding means, at least in said second zone, comprising rolls spaced along said path; and
   means in a third zone along said path for applying a preservative on said face of each plate.

2. Apparatus as set forth in claim 1 wherein said heating means comprises means located above the path of said plates in said first zone for directing heat on the upper faces of the plates.

3. Apparatus as set forth in claim 2 wherein said means for directing heat on the upper faces of the plates comprises electrical heating means and means for reflecting heat therefrom down on to the upper faces of the plates.

4. Apparatus as set forth in claim 2 wherein said feeding means comprises conveyor means through which heat may radiate in the first zone and wherein means is provided below said conveyor means in the first zone for reflecting heat back up toward the conveyor means in said first zone.

5. Apparatus as set forth in claim 1 having a chamber enclosing the feeding means and the heating means in the first zone, said chamber having an entrance opening for entry of plates and an exit opening for exit of plates, said feeding means comprising conveyor means for feeding plates through said chamber from said entrance opening to and through said exit opening and through said second and third zones for the heating and cooling of the plates followed by the application of preservative thereto.

6. Apparatus as set forth in claim 5 wherein said heating means comprises a series of heaters in said chamber above said conveyor means in said chamber for directing heat down on the upper faces of the plates being fed through said chamber.

7. Apparatus as set forth in claim 5 wherein said conveyor means comprises a series of rolls in said chamber for supporting a plate as it is fed forward through the chamber and means for driving the rolls to feed the plates forward.

8. Apparatus for processing lithographic plates which have been exposed and developed and which have in their printing areas a thermal curing agent or agents adapted on being heated to cure to a more abrasion resistant and solvent resistant state, comprising:
means for feeding plates forward one after another in a predetermined path with the exposed and developed face of the plate facing up;
means in a first zone along said path for heating each plate to a temperature such as to effect the curing of the curing agent or agents; means in a second zone along said path for temperate cooling of each plate without wrinkling the plate;
means in a third zone along said path for applying a preservative on said face of each plate;
said cooling means comprising means for blowing air on the plates and means downstream from the air blowing means for spraying water on the plates.

9. Apparatus as set forth in claim 8 wherein the water spraying means sprays water down on the upper faces of the plates and wherein means is provided downstream from the spraying means for scrubbing the sprayed upper faces of the plates for washing them.

10. Apparatus for processing lithographic plates after they have been exposed and developed comprising:
means for feeding plates forward one after another in a predetermined path with the exposed and developed face of the plate facing up;
means in a first zone along said path for heating each plate;
means in a second zone along said path for cooling each plate, the cooling means comprising means for blowing air on the plates and means downstream from the air blowing means for spraying water down on the upper faces of the plates; and
means downstream from the spraying means for scrubbing the sprayed upper faces of the plates for washing them;
means in a third zone along said path for applying a preservative on said face of each plate; and
a chamber enclosing the feeding means and the heating means in the first zone, said chamber having an entrance opening for entry of plates and an exit opening for exit of plates, said feeding means comprising conveyor means for feeding plates through said chamber from said entrance opening to and through said exit opening and through said second and third zones for the heating and cooling of the plates followed by the application of preservative thereto;
said conveyor means comprising a series of rolls in said chamber for supporting a plate as it is fed forward through said chamber, a first pair of feed rolls spaced downstream from the exit opening of said chamber adapted to receive a plate exiting from the chamber and feed it forward, a second pair of feed rolls spaced downstream from the first pair adapted to receive a plate fed forward by the first pair and feed it forward, a third pair of feed rolls spaced downstream from the second pair adapted to receive a plate fed forward by the second pair and feed it forward, the air blowing means being adjacent the exit opening of said chamber upstream from said first pair of rolls, the water spraying and scrubbing means being between the first and second pairs of rolls, the preservative applying means being between the second and third pairs of rolls, and said apparatus having means for driving the rolls to feed the plates forward.

11. Apparatus as set forth in claim 10 wherein said heating means comprises a series of heaters in said chamber above said conveyor means in said chamber for directing heat down on the upper faces of the plates being fed through said chamber.

12. Apparatus as set forth in claim 10 wherein said air blowing means comprises means for blowing air upwardly on the bottom of a plate as the plate exits through said exit opening of said chamber.

13. Apparatus as set forth in claim 12 having a platen over which a plate is fed between the first and second pair of feed rolls, said rubbing means rubbing the upper face of a plate as it travels over said platen.

14. Apparatus as set forth in claim 13 wherein the rubbing means comprises an elongate bar extending transversely of the apparatus on the platen, a brush carried by the bar, and means for moving the bar back and forth crosswise of the apparatus.

15. Apparatus as set forth in claim 14 wherein the means for moving the bar moves it with an orbital motion.

16. Apparatus as set forth in claim 13 wherein said preservative applying means comprises a second platen over which a plate is fed between the second and third pair of feed rolls, second means for rubbing the upper face of a plate as it travels over said second platen, and means for delivering preservative onto the upper face of the plate between the second pair of feed rolls and the said second rubbing means.

17. Apparatus as set forth in claim 16 wherein said preservative delivering means comprises nozzle means, means mounting said nozzle means for movement transversely of said path above said path, and means for moving said nozzle means transversely of said path back and forth over a plate as the plate is fed forward below the nozzle means.

18. Apparatus for processing lithographic plates which have been exposed and developed and upon which a protective coating has been applied to the exposed and developed face and which has in its printing areas a thermal curing agent or agents adapted on being heated to cure to a more abrasion resistant and solvent resistant state, comprising:

means for feeding plates forward one after another in a predetermined path with the exposed and developed face of the plate facing up;

means in a first zone along said path for heating each plate to a temperature such as to effect the curing of the curing agent or agents;

means in a second zone along said path for washing each plate with water to remove the protective coating on the exposed and developed face;

said feeding means, at least in said second zone, comprising rolls spaced along said path; and means in a third zone along said path for applying a preservative on said face of each plate.

19. Apparatus as set forth in claim 18 wherein said heating means comprises means located above the path of said plates in said first zone for directing heat on the upper faces of the plates.

20. Apparatus as set forth in claim 19 wherein said means for directing heat on the upper faces of the plates comprises electrical heating means and means for reflecting heat therefrom down on to the upper faces of the plates.

21. Apparatus as set forth in claim 19 wherein said feeding means comprises conveyor means through which heat may radiate in the first zone and wherein means is provided below said conveyor means in the first zone for reflecting heat back up toward the conveyor means in said first zone.

22. Apparatus as set forth in claim 18 having a chamber enclosing the feeding means and the heating means in the first zone, said chamber having an entrance opening for entry of plates and an exit opening for exit of plates, said feeding means comprising conveyor means for feeding plates through said chamber from said entrance opening to and through said exit opening and through said second and third zones for the heating and washing of the plates followed by the application of preservative thereto.

23. Apparatus as set forth in claim 22 wherein said heating means comprises a series of heaters in said chamber above said conveyor means in said chamber for directing heat down on the upper faces of the plates being fed through said chamber.

24. Apparatus as set forth in claim 22 wherein said conveyor means comprises a series of rolls in said chamber for supporting a plate as it is fed forward through the chamber and means for driving the rolls to feed the plates forward.

25. Apparatus as set forth in claim 18 wherein said washing means comprises means for spraying water on the upper face of each plate and means for scrubbing the sprayed upper faces of the plates.

26. Apparatus as set forth in claim 25 wherein the water spraying means sprays warm water on the upper face of each plate.

27. A method of processing a lithographic plate which has been exposed and developed and upon which a protective coating has been applied to the exposed and developed face, said plate having in its printing areas a thermal curing agent or agents adapted on being heated to cure to a more abrasion resistant and solvent resistant state, comprising the steps of:

heating the plate to a temperature such as to effect the curing of the curing agent or agents;

feeding the plate forward by contacting it only at spaced points as it is fed forward;

cooling the plate temperately without wrinkling the plate as it is fed forward;

washing the plate to remove the protective coating on the exposed and developed face as it is fed forward; and applying a preservative on the exposed and developed face of the plate as it is fed forward.

28. A method of processing a lithographic plate which has been exposed and developed and upon which a protective coating has been applied to the exposed and developed face, said plate having in its printing areas a thermal curing agent or agents adapted on being heated to cure to a more abrasion resistant and solvent resistant state, comprising the steps of:

heating the plate to a temperature such as to effect the curing of the curing agent or agents;

cooling the plate temperately without wrinkling the plate;

washing the plate to remove the protective coating on the exposed and developed face; and applying a preservative on the exposed and developed face of the plate;

the step of cooling the plate including blowing air on the plate.

29. A method of processing a lithographic plate which has been exposed and developed and upon which a protective coating has been applied to the exposed and developed face, said plate having in its printing areas a thermal curing agent or agents adapted on being heated to cure to a more abrasion resistant and solvent resistant state, comprising the steps of:

heating the plate to a temperature such as to effect the curing of the curing agent or agents;

cooling the plate temperately without wrinkling the plate;

washing the plate to remove the protective coating on the exposed and developed face; and applying a preservative on the exposed and developed face of the plate;

the step of cooling the plate including first blowing air on the plate and then spraying water on the plate.

\* \* \* \* \*